(12) United States Patent
    Kitagawa

(10) Patent No.: US 9,729,131 B2
(45) Date of Patent: Aug. 8, 2017

(54) SYSTEM AND METHOD FOR DUTY CYCLE CORRECTION

(71) Applicant: Micron Technology, Inc., Boise, ID (US)

(72) Inventor: Katsuhiro Kitagawa, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/866,250

(22) Filed: Sep. 25, 2015

(65) Prior Publication Data

US 2017/0093386 A1  Mar. 30, 2017

(51) Int. Cl.
    *H03K 5/156* (2006.01)

(52) U.S. Cl.
    CPC .................. *H03K 5/1565* (2013.01)

(58) Field of Classification Search
    CPC ..... H03L 7/0891; H03L 7/0814; H03L 7/087; H03K 7/08; H03K 5/01; H03K 5/04; H03K 5/1565; H04L 7/033
    See application file for complete search history.

(56) References Cited

U.S. PATENT DOCUMENTS

| | | | |
|---|---|---|---|
| 7,414,451 B2* | 8/2008 | Lee | G11C 7/22 327/161 |
| 7,528,639 B2* | 5/2009 | Choi | H03L 7/0812 327/158 |
| 2015/0002201 A1* | 1/2015 | Kitagawa | H03K 5/1565 327/175 |

FOREIGN PATENT DOCUMENTS

WO    2014203775 A1    12/2014

\* cited by examiner

*Primary Examiner* — Long Nguyen
(74) *Attorney, Agent, or Firm* — Dorsey & Whitney LLP

(57) ABSTRACT

Apparatuses and methods for correcting a duty cycle of a clock signal are described. An example apparatus includes: a duty cycle corrector (DCC) that receives an input clock signal and a control signal and produces an output clock signal responsive, at least in part, to the input clock signal and the control signal; a circuit that divides a frequency of the input clock signal by a positive even integer and generates an intermediate clock signal; and a phase detector that generates the control signal responsive, at least in part, to a difference in phase between the output clock signal and the intermediate clock signal.

18 Claims, 12 Drawing Sheets

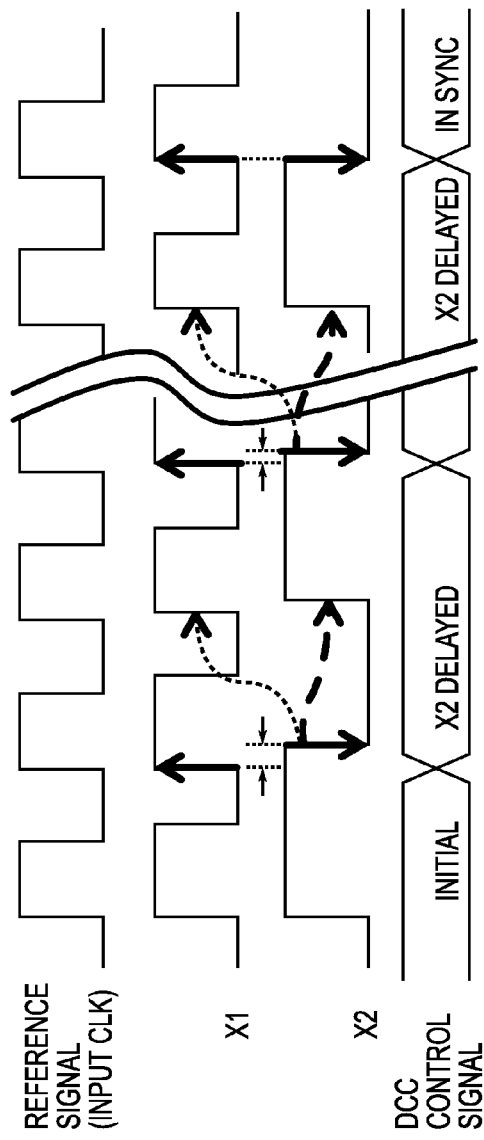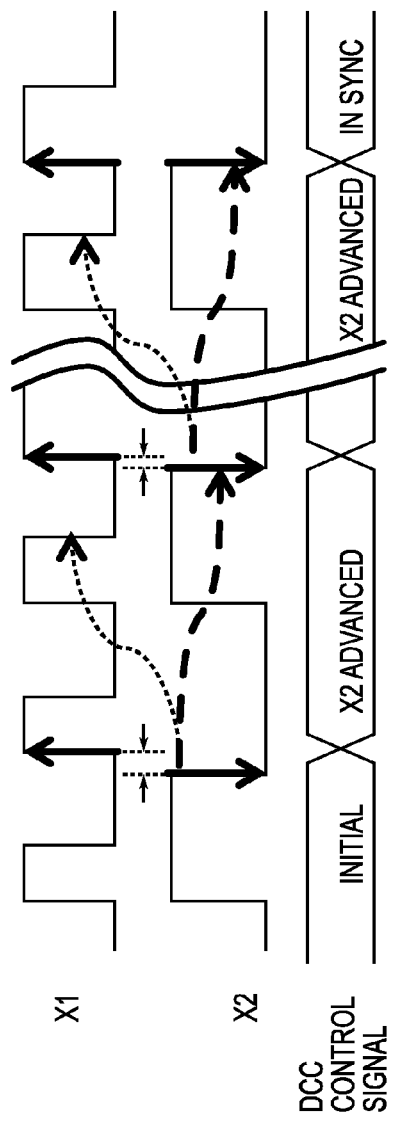

SYSTEM AND METHOD FOR DUTY CYCLE CORRECTION

BACKGROUND

In a semiconductor memory device, improvement of signal propagation characteristics has become an important theme among various types of improvements of an operating speed of the semiconductor device. In a typical dynamic random-access memory (DRAM) product, correcting a duty cycle of an input signal and obtaining an output duty cycle of 50% by using a combination of a duty cycle detector (DCD) and a duty cycle corrector (DCC) have become a popular solution for improving the signal propagation characteristics. The DCD and the DCC as shown in FIG. 1 are circuits designed for correcting output waveforms. However, including the DCD and the DCC in semiconductor products such as DRAM may cause disadvantages such as a larger chip area for implementing the circuits and more power consumption due to increased electric currents to operate the DCD and DCC circuits.

In recent years, there has been an effort to correct the duty cycle. Adjusting a through rate of a clock signal by fine tuning of a bias level of transistors has been known. As another attempt, for example, WO2014/203775 A1 describes a highly noise-resistant high-precision duty regulator circuit including a plurality of clocked invertors. The plurality of clocked invertors coupled in parallel can be controlled independently, thus complexity of the DCC required for fine tuning of different bias levels can be reduced.

BRIEF DESCRIPTION OF THE DRAWINGS

FIG. 2b is a timing chart of signals in the circuit of FIG. 2a.

FIG. 5b is a timing chart including waveforms of the derivative clock signals of FIG. 5a.

FIG. 7a is a timing chart of duty-cycle displacement of a falling edge of an observed signal that is delayed, in view of the time relationship shown in FIG. 6, according to an embodiment of the present disclosure.

FIG. 7b is a timing chart of duty-cycle displacement of the falling edge of the observed signal that is advanced, in view of the time relationship shown in FIG. 6, according to the present disclosure.

DETAILED DESCRIPTION OF PREFERRED EMBODIMENTS

A duty cycle correction system including a duty cycle detector (DCD) and a duty cycle corrector (DCC) have been implemented in semiconductor devices, in order to improve signal propagation characteristics. The DCD is used to control the DCC to carry out duty cycle correction and keep the DCD detected cycle approximately 50%.

Figure 1:
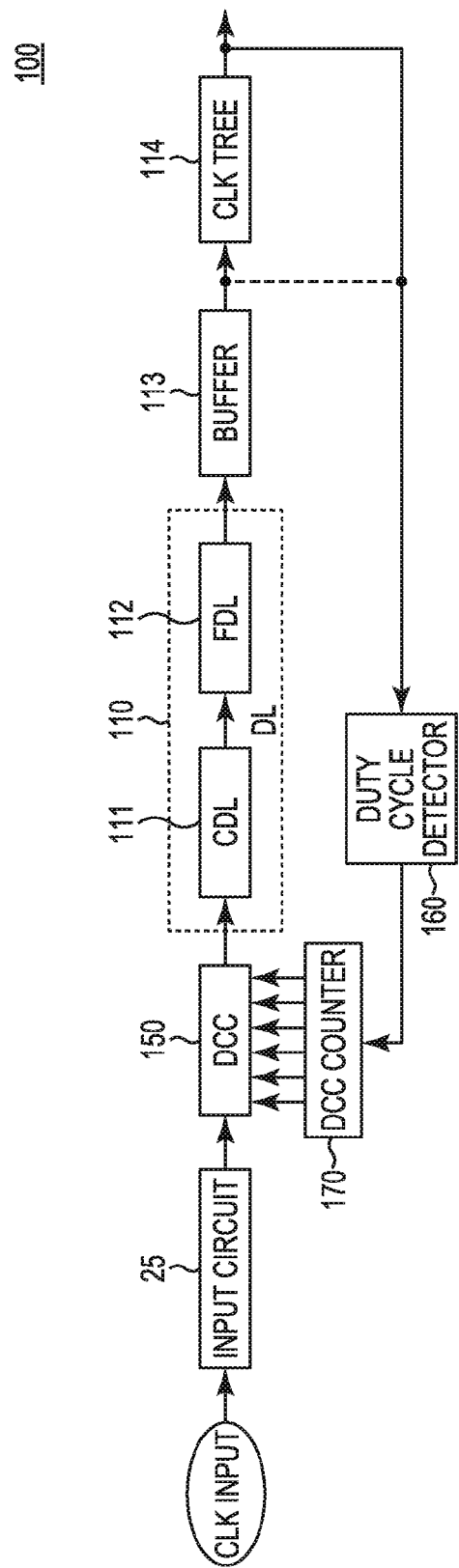
FIG. 1 is a simplified block diagram of a conventional delay locked loop (DLL) circuit in a semiconductor device.

FIG. 1 is a simplified block diagram of a conventional delay locked loop (DLL) circuit in a semiconductor device that includes a duty cycle correction system. A DCD 160 may be coupled to an input node or at an output node of a clock tree 114 to receive a signal to be detected. The DCD 160 is illustrated in FIG. 1 as coupled to the output of the clock tree 114. The DCD 160 typically is a duty-cycle detecting circuit, that may detect a ratio of the duty cycle of the semiconductor device, for example, detect whether a duty cycle ratio of the semiconductor device is larger, equal or smaller than 50%. A DCC 150 typically is a duty-cycle correcting circuit located on a signal path between an input and an output of a system. Based on detection results at the DCD 160, a signal is provided to a DCC counter 170 to set timings for controlling the DCC 150. The DCC 150 receives an input signal from an input circuit 25, and corrects duty cycle error of the input signal to provide a duty-cycle corrected signal as an output signal of the DCC 150 based on the timings provided by the DCC counter 170. The DCC output signal is further processed for delay control at a delay line 110, which may include a coarse delay line 111 and a fine delay line 112, and provided to an output buffer 113. The DCD and the DCC implemented as shown in FIG. 1 may cause disadvantages including, but not limited to, a larger chip area for implementing the DCD and the DCC and more power consumption due to increased electric currents to operate the DCD and DCC.

Figure 2A:
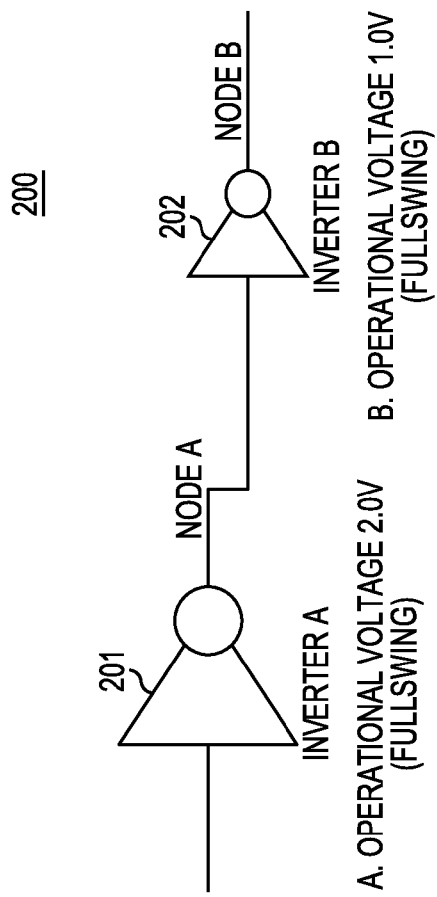
FIG. 2a is a block diagram of an example of a circuit causing duty cycle displacement.

In recent memory products with high-speed access, such as series of double data rate synchronous dynamic random-access memory (DDR SDRAM), namely DDR 3/4, specifications of an input signal "CK" allowing a duty cycle strictly controlled to about 50±1% are stricter compared with those of earlier DDR SDRAM such as DDR 1/2. However, there are some issues that remain after introducing such strict input signal specification, such as displacement of the duty cycle generated during signal propagation inside an electronic circuit. There are several factors contributing to the duty cycle displacement, and one of such factors is a level shifter circuit as shown in FIG. 2a. For example, the level shifter circuit of FIG. 2a includes two inverters, an inverter A 201 having an operating voltage of 2.0V, and an inverter B 202 having an operating voltage of 1.0V that receives an output signal of the inverter A 201 as an input signal via node A. The output signal of the invertor A 201 has a fixed rise time (tR) and a fall time (tF). Here, potentials to invert signals are 50% of operating voltages, thus such potentials of the inverters A 201 and B 202 are 1.0V and 0.5V, respectively. In this example, an output signal of the inverter B 202 at a node B is not able to have a duty cycle of 50%, because the inversion of signals for the inverter B 202 occur while the node A is in periods of the tR and tF at different timings from those of the inverter A 201, due to the difference in the inversion potentials.

Figure 2B:
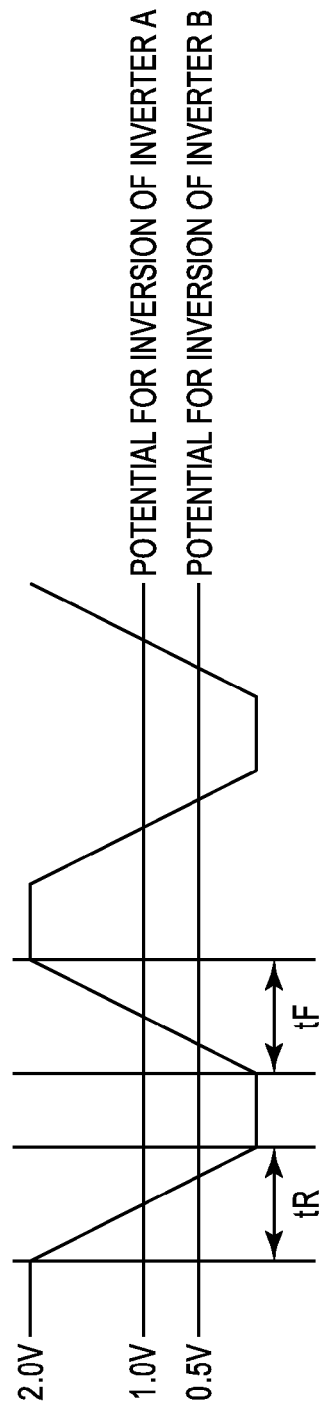

As shown in FIG. 2b, the duty cycle of a signal propagating in a semiconductor device having a level shifter circuit may intrinsically be displaced before and/or after the level shifter circuit. Therefore, detection of such duty-cycle displacement by a DCD after blocks which may cause duty-cycle displacement and correction using a DCC combined with the DCD have been executed. Typically, a degree of displacement of the duty cycle is different from device to device; the DCC and the DCD are provided on each device to correct the output duty cycle. In current semiconductor devices, the factors contributing to such duty-cycle displacement are not limited to the level shifter in a signal propagation path. Therefore, a novel technique, correcting duty-cycle displacement on propagation path while decreasing area for the DCD and the DCC is desired.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 3:
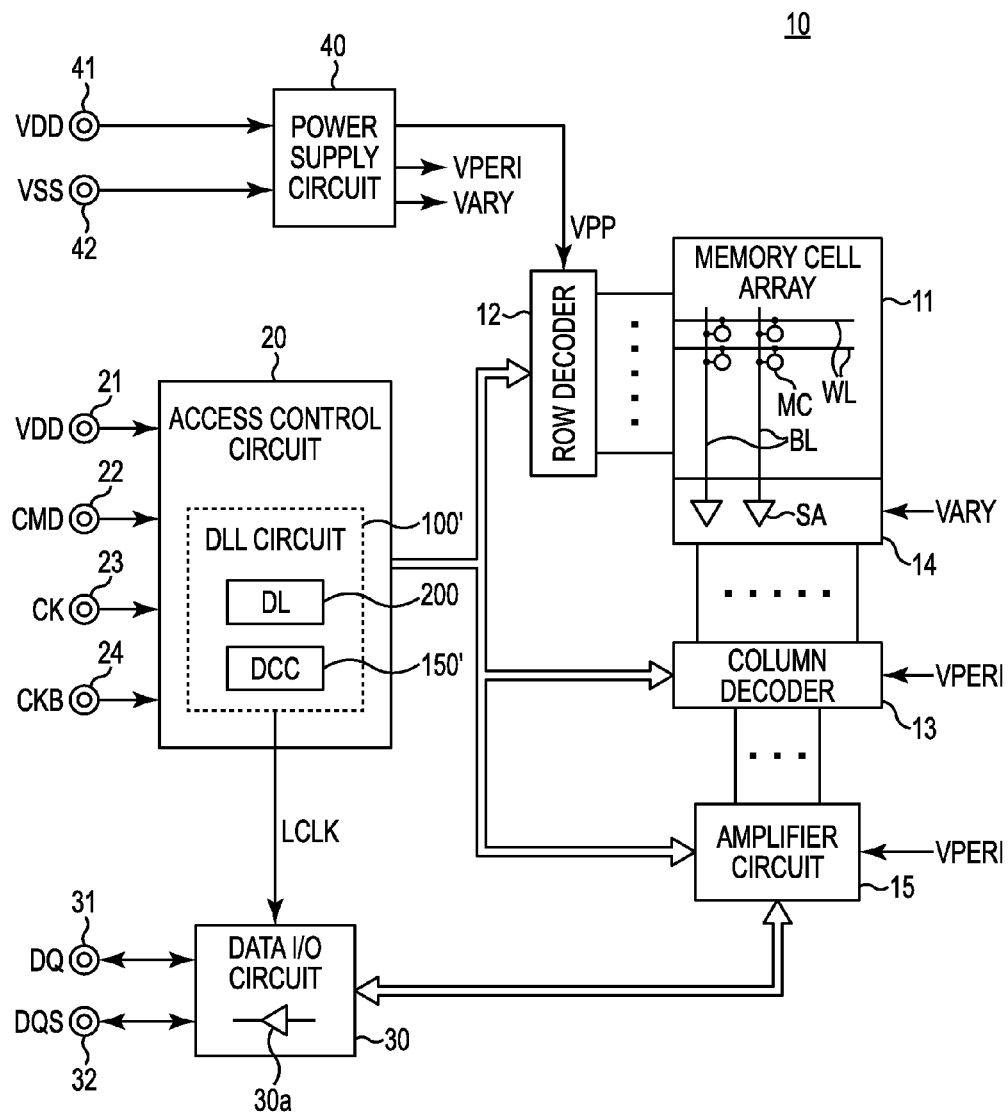
FIG. 3 is a block diagram of a semiconductor device according to the present disclosure.

FIG. 3 is a block diagram of a semiconductor device 10 including a DLL circuit 100', in accordance with an embodiment of the present disclosure. The semiconductor device 10 includes the memory cell array 11, that includes a plurality of word lines WL and a plurality of bit lines BL intersecting with each other and a plurality of memory cells MC arranged at intersections thereof. A row decoder 12 selects a word line WL and a column decoder 13 selects a bit line BL. The bit lines BL are coupled to corresponding sense amplifiers SA in a sense circuit 14, respectively, and a bit line BL selected by the column decoder 13 is connected to the amplifier circuit 15 through the corresponding sense amplifier SA. An access control circuit 20 controls operations of the row decoder 12, the column decoder 13, the sense circuit 14, and the amplifier circuit 15. The semiconductor device 10 includes a plurality of access terminals 21 to 24 at the access control circuit 20 that receive an address signal ADD, a command signal CMD, external clock signals CK and CKB, and the like. The external clock signals CK and CKB are complementary to each other. The access control circuit 20 controls the row decoder 12, the column decoder 13, the sense circuit 14, the amplifier circuit 15, and a data input/output circuit 30 based on these signals.

When the command signal CMD indicates an active command ACT, the address signal ADD is supplied to the row decoder 12. The row decoder 12 selects a word line WL in response to the address signal ADD and accordingly corresponding memory cells MC are connected to the corresponding bit lines BL, respectively. The access control circuit 20 then activates the sense circuit 14 at a predetermined timing. When the command signal CMD indicates a read command RD or a write command WT, the address signal ADD is supplied to the column decoder 13. The column decoder 13 couples a bit line BL indicated by the address signal ADD to the amplifier circuit 15. Accordingly, in a read operation, read data DQ that are read from the memory cell array 11 through the corresponding sense amplifier SA are provided at the data terminal 31 through the amplifier circuit 15 and the data input/output circuit 30. In a write operation, write data DQ that are received at the data terminal 31 and are written into the corresponding memory cells MC through the data input/output circuit 30, the amplifier circuit 15 and the sense amplifier SA.

As shown in FIG. 3, the access control circuit 20 includes the DLL circuit 100'. The DLL circuit 100' generates an internal clock signal LCLK that is phase-controlled based on the external clock signals CK and CKB. The DLL circuit 100' includes a delay line (DL) 110 for delaying the internal clock signal LCLK and the DLL circuit 100' further includes a DCC 150'. The details of the DLL circuit 100' are described later. The internal clock signal LCLK is supplied to an output buffer circuit 30a in the data input/output circuit 30. The read data from the memory cell array 11 is output from the data terminal 31 in synchronization with the internal clock signal LCLK.

Each of circuit blocks described above uses a predetermined internal voltage as its operating power supply. Such internal power supplies are generated by a power supply circuit 40 shown in FIG. 3. The power supply circuit 40 receives an external potential VDD and a ground potential VSS that are supplied through power supply terminals 41 and 42, respectively. Based on the potentials, the power supply circuit 40 generates internal voltages VPP, VPERI, VARY, etc. The internal potential VPP is generated by boosting the external potential VDD. The internal potentials VPERI and VARY are generated by stepping down the external potential VDD. The internal voltage VPP is mainly used in the row decoder 12. The row decoder 12 drives a word line WL selected based on the address signal ADD to the VPP level, thereby making the cell transistors in the memory cells MC conductive. The internal voltage VARY is mainly used in the sense circuit 14. The sense circuit 14, when activated, drives either one of each pair of bit lines to the VARY level and the other to the VSS level, thereby amplifying read data that is read out. The internal voltage VPERI is used as the operating voltage of most of the peripheral circuits such as the access control circuit 20. Using the internal voltage VPERI lower than the external voltage VDD as an operating voltage of the peripheral circuits reduces power consumption of the semiconductor device 10.

Figure 4:
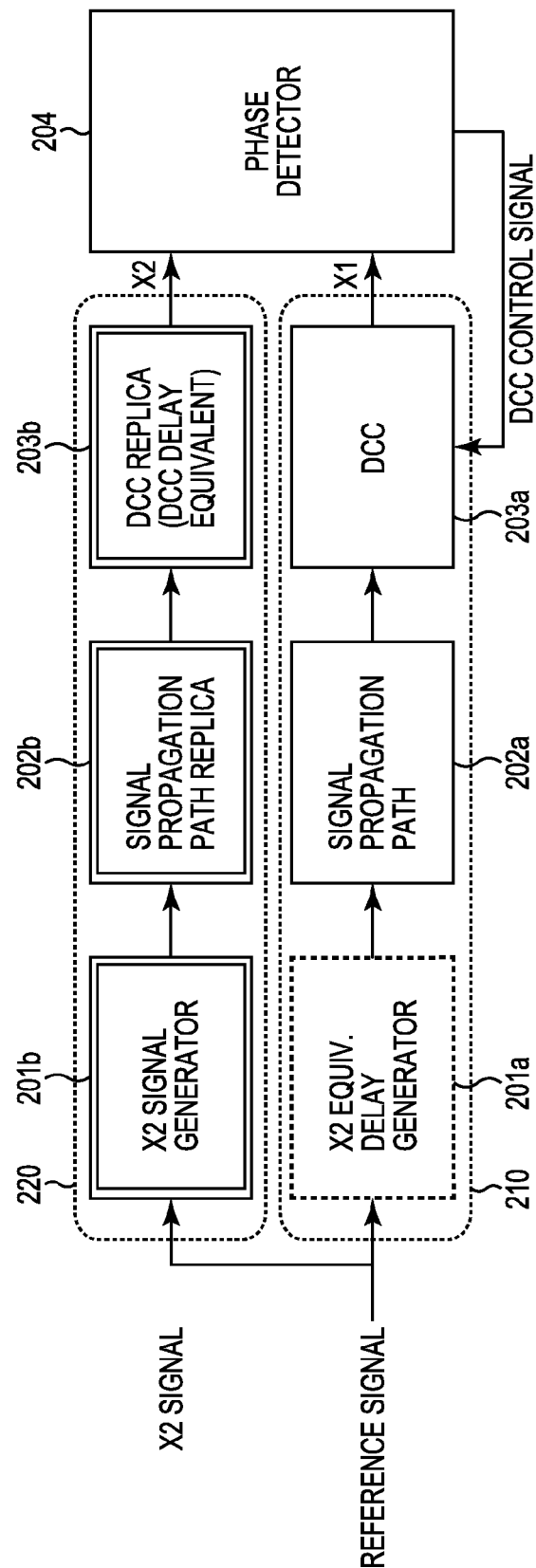
FIG. 4 is a schematic block diagram of a DCC system for controlling duty-cycle displacement, according to an embodiment of the present disclosure.

FIG. 4 is a schematic block diagram of a DCC system for controlling duty-cycle displacement, according to an embodiment of the present disclosure. Note that the DCC system may be applicable to any circuit in which duty cycle adjustment is desirable, and is not limited to a DLL circuit. An input clock signal (which may also be referred to as a "reference signal") is provided to two signal paths, a first path 210 and a second path 220, which provides an x2 signal having a clock cycle that is double the clock cycle of the reference signal. An x2 equivalent delay generator 201a is provided to model the propagation delay of the x2 signal generator of the first path 210. The reference signal may be provided to the x2 equivalent delay generator 201a of the second path 220 and an x2 signal generator 201b of the first path 210.

Figure 5A:
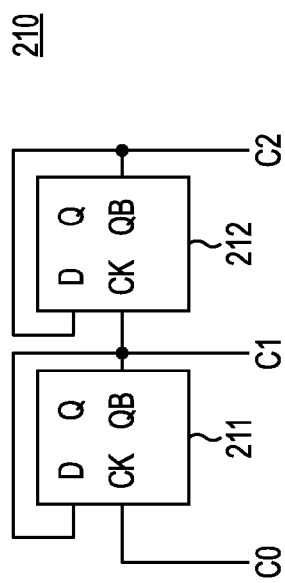
FIG. 5a is a block diagram of a circuit for providing derivative clock signals of a reference signal according to an embodiment of the present disclosure.
Figure 5B:
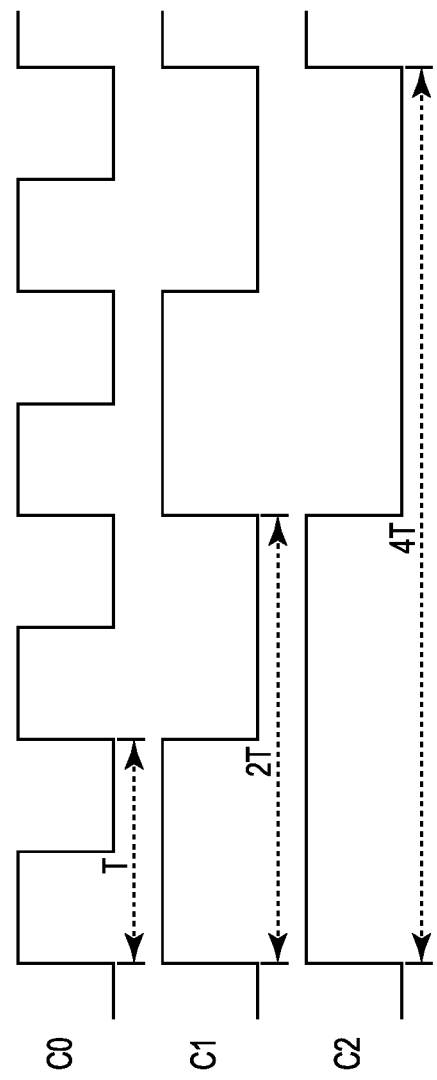

FIG. 5a is a block diagram of a sample circuit for providing derivative clock signals of a reference signal according the present disclosure. An example of the x2 signal generator 201b in FIG. 4 may be a doubled to a quadrupled cycle generating circuit 210 using a ripple counter (typically used as a frequency divider), including one or more flip-flops, as shown in FIG. 5a. While a doubled cycle or a quadrupled cycle generating circuit may be used, the frequency divider may be able to divide a frequency of an input clock signal by N, where N is an integer more than one, such as a positive even integer. When an input clock signal C0 having a clock cycle (tCK) of T, namely a reference signal, is provided to this circuit 210 as a clock signal of a first flip-flop 211, a first output signal C1 having a clock cycle of 2T, namely x2 signal, is obtained. The first output signal C1 having a cycle of 2T is provided as an input signal to a second flip-flop 212 and a second output signal C2 having a clock cycle of 4T, namely x4 signal, can be obtained. FIG. 5b is a timing chart including waveforms of the reference clock C0, the derivative clock signals C1 and C2 of FIG. 5a. In this example, operations of the ripple counter correspond to rising edges, a duty cycle of the x2 signal is kept about 50% regardless of a duty cycle of the reference signal.

The second path 220 in FIG. 4 may include a signal propagation path replica circuit 202b having a structure equivalent to a structure of a propagation path 202a of the reference signal. In addition, a DCC replica circuit 203b equivalent to a delay of a DCC 203a may be inserted to the second path. Also, the DCC replica circuit may be configured to copy an output variation of the DCC 203a responsive to the DCC control signal according to receiving the DCC control signal as well as the DCC 203a. As a result, the propagation times of the reference signal and the x2 signal are substantially the same, thus the reference signal and the x2 signal are designed to arrive at a phase detector 204 approximately simultaneously. The phase detector 204 may function as a comparison circuit, which receives the reference signal and the x2 signal at ends of two paths, compares these signals, and provides a DCC control signal to the DCC 203a.

The phase detector 204 detects a pulse type of a target signal when a reference signal is in a certain state (e.g., a rising/falling edge of a pulse is observed, etc.). For example, the phase detector 204 monitors the target signal when the reference signal is at a rising edge of a pulse. If the target signal is in a logic "low" state, the phase detector 204 detects a pulse type "L" from the target signal and determines that the reference signal is ahead of the target signal. On the other hand, if the target signal is in a logic "high" state, the phase detector 204 detects a pulse type "H" from the target signal and determines that the reference signal is lagging the target signal. Because the rising edge of the reference signal is a reference timing of observation, a rising edge of the target signal where the pulse type switches from "L" to "H" is a target edge (which may also be referred to as a "edge boundary") to be controlled. Fine tuning the timing of the target edge is executed by gradually adding or subtracting delays until a target edge is adjusted to match the rising edge of the reference signal. Thus, a DLL system using a phase detector eliminates a phase difference between an input signal and an output signals.

Figure 6:
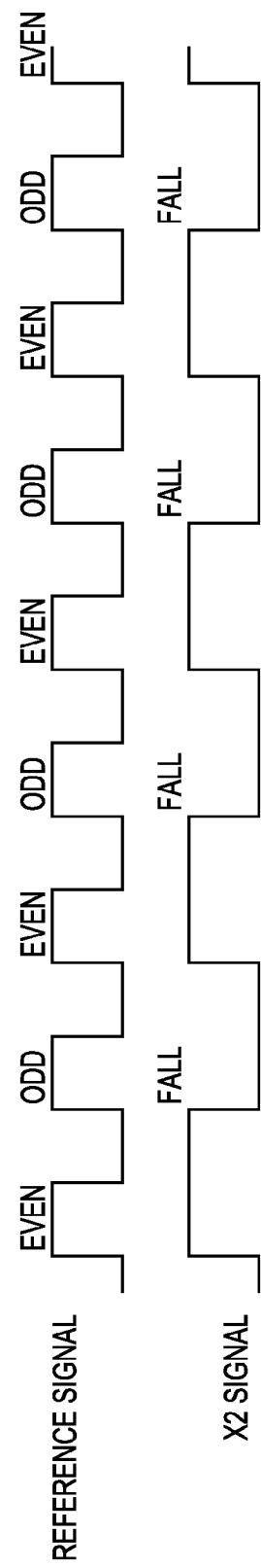
FIG. 6 is a timing chart of a time relationship between odd and even cycles of the reference signal and falling edges of an x2 signal, according to an embodiment of the present disclosure.

In one embodiment, the target signal with respect to the reference signal may be the x2 signal. The phase detector 204 receives the reference signal and the x2 signal and compares phases of the reference signal and the x2 signal. The x2 signal has been processed by a frequency divider to have a 2T clock cycle twice that of the reference cycle T. FIG. 6 is a timing chart of a time relationship between odd and even cycles of the reference signal and falling edges of an x2 signal, according to an embodiment of the present disclosure. At each "Odd" cycle of the reference signal in FIG. 6, the reference signal has a rising edge whereas the x2 signal has a falling edge. Duty-cycle displacement during signal propagation of the reference signal can be observed if the falling edge of the x2 signal is displaced either forward or backward when the reference signal has a rising edge. If the falling edge of the x2 signal is ahead of the rising edge of the odd cycle of the reference signal, the signal propagation path has caused duty-cycle displacement in a direction of decreasing the duty cycle. On the other hand, if the falling edge of the x2 signal is lagging the rising edge of the odd cycle of the reference signal, the signal propagation path has caused duty-cycle displacement in a direction of increasing the duty cycle, thus the falling edges are delayed. If the falling edge of the x2 signal and the rising edge of the odd cycle of the reference signal coincide, it is possible that there is no duty-cycle displacement or that the displacement is beyond a threshold of detection. The phase detector 204 detects the duty-cycle displacement and the detected displacement information is transmitted to the DCC 203a which corrects the duty cycle accordingly. The correction amount thereof corresponds to the amount of displacement included in the detected displacement information. This correction process is continued until the displacement is no longer detected.

FIGS. 7a and 7b are timing charts of duty-cycle displacement observed when a falling edge of an observed signal is either delayed or advanced, in view of the time relationship shown in FIG. 6, according to an embodiment of the present disclosure. The duty-cycle displacement is illustrated in view of a relationship between the reference signal and the x2 signal before and after frequency division received at the phase detector 204. In FIGS. 7a and 7b, "Input CLK" signal is the reference signal, "X1" signal is an output signal of the DCC 203a to be adjusted, and "X2" signal is the x2 signal which is an output signal of the DCC replica 203b as shown in FIG. 4. Due to duty-cycle displacement in the signal propagation of the X1 signal which is to be adjusted, the X1 signal and the reference signal, even having the same cycle, have different duty cycles. A rising edge of the X1 signal is in synchronization with a rising edge of the reference signal. Every other rising edge of the X1 signal scheduled to be synchronized with a falling edge of the X2 signal can be used as a reference timing to monitor the X2 signal. As described earlier, the phase detector 204 detects the falling edge of the X2 signal.

In FIG. 7a, when the falling edge of the X2 signal is lagging the rising edge of the X1 signal at the reference timing, the phase detector 204 provides a DCC control signal to the DCC 203a to increase a delay of the rising edge of the X1 signal as shown in dotted arrows. The rising edge of the X2 signal may also be adjusted to reduce its delay by providing a DCC control signal equivalent to the DCC replica, as well as the rising edge of X1 by DCC as shown in dashed arrows. This adjustment by the DCC control signal is executed recursively until the falling edge of the X2 signal and the rising edge of the X1 signal at the reference timing are synchronized with each other. In this manner, the duty cycle of the X1 signal is corrected.

In FIG. 7b, when the falling edge of the X2 signal is leading the rising edge of the X1 signal at the reference timing, the phase detector 204 provides the DCC control signal to the DCC 203a to increase the delay of the falling edge of the X1 signal as shown in dotted arrows. The falling edge of the X2 signal may also be adjusted to increase its delay by providing the DCC control signal equivalent to the DCC replica, as well as the falling edge of X1 by DCC as shown in dashed arrows. This adjustment by the DCC control signal is executed recursively until the falling edge of the X2 signal is delayed to be synchronized with the rising edge of the X1 signal at the reference timing. In this manner, the duty cycle of the X1 signal is corrected.

Figure 8:
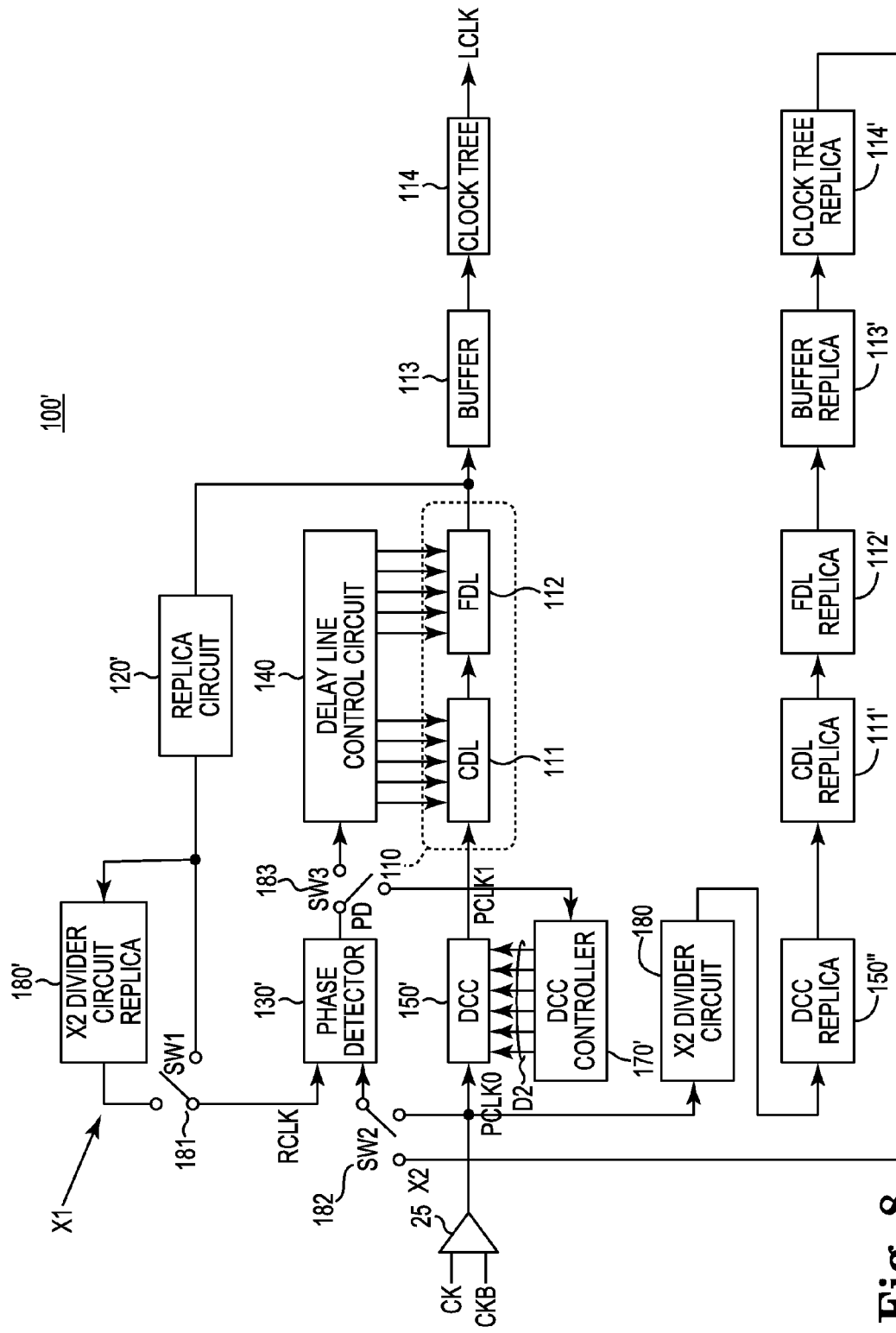
FIG. 8 is a simplified block diagram of a DLL circuit in a semiconductor device according to an embodiment of the present disclosure.

FIG. 8 is a block diagram of a DCC system in a DLL circuit 100', according to one embodiment for controlling a duty-cycle displacement. The DLL circuit 100 includes a delay line 110 which generates an internal clock signal LCLK by delaying an internal clock PCLK1. Here, the internal clock signal PCLK1 is an output signal of a duty cycle corrector (DCC) 150' which receives an internal clock signal PCLK0 output from a clock receiver 25 upon receipts of external clock signals CK and CKB. The delay line 110 includes a coarse delay line (CDL) 111 having a coarse step size of delay adjustment and a fine delay line (FDL) 112 having a fine step size of delay adjustment, in a series connection. An output signal of the delay line 110 is provided as the internal clock LCLK via a buffer 113 and a clock tree 114. The internal clock LCLK may be provided, for example, to an output buffer circuit 30a of a data I/O circuit 30 in FIG. 3. The internal clock signal LCLK can be used as a reference signal for controlling timings of providing read data DQ 31 and a data strobe signal DQS 32 in FIG. 3.

The output signal of the delay line 110 is also supplied to a replica circuit 120'. The replica circuit 120' represents a delay equivalent to a sum of delays including a delay of the buffer 113, a delay of the clock tree 114, a delay of the output buffer circuit 30a of the data I/O circuit 30, and a delay of the DCC 150'. The replica circuit 120' may also compensate a delay at an input-signal frequency divider circuit 180 (which may also be referred to as an "X2 divider circuit"). Alternatively, this compensation may be executed in the X2 divider circuit 180. The details of the X2 divider circuit 180 are described below. A first switch (SW1) 181 may switch between an output node of the X2 divider circuit 180 and an output node of the replica circuit 120' to couple a first input node of a phase detector 130' to the replica circuit 120' in a phase correction (DLL) mode and to the X2 divider circuit replica 180' in a duty cycle correction (DCC) mode. A second switch (SW2) 182 may couple a second input node of the phase detector 130' to the clock buffer 25 in the DLL mode and to the clock tree replica 114' in the DCC mode. A third switch (SW3) 183 may couple an output node of the phase detector 130' to a delay line control circuit 140 in the DLL mode and to the DCC controller 170' in the DCC mode. A DCC replica 150" represents a delay equivalent to a delay of the DCC 150' and corresponds to the DCC replica 203b in FIG. 4. A CDL replica 111' represents a delay equivalent to a delay of the CDL 111. A FDL replica 112' represents a delay equivalent to a delay of the FDL 112. A buffer replica 113' represents a delay equivalent to a delay of the buffer 113. A clock tree replica 114' represents a delay equivalent to a delay of the clock tree 114. The CDL replica 111', the FDL replica 112', the buffer replica 113' and the clock tree replica 114' are corresponding to the signal propagation path replica 202b in FIG. 4. The X2 divider circuit replica 180' is a replica of an X2 divider circuit 180 and corresponding to the X2 equiv. delay generator 201a in FIG. 4. The signal to activate the SW1 181 may also be provided to the phase detector 130' and the replica circuit 120' in order to switch output signals accordingly between the DLL mode and the DCC mode.

In the DLL mode, the SW1 181 is coupled to the replica circuit 120' and an output signal of the replica circuit 120' is provided as a replica clock signal RCLK based on the internal clock signal LCLK. Also, the SW2 182 is coupled to an output node of the clock receiver 25 and the internal clock signal PCLK0 is provided. The read data DQ 31 and the data strobe signal DQS 32 are in synchronization with the replica clock signal RCLK when the output buffer circuit 30a provides the read data DQ 31 and the data strobe signal DQS 32 in synchronization with the internal clock signal LCLK.

In a semiconductor device with high speed memory access, the read data DQ and the data strobe signal DQS need to be in synchronization with the external clock signals CK and CKB. The phase detector 130' detects a phase shift between the replica clock signal RCLK and the internal clock signal PCLK0 reflecting the external clock signals CK and CKB. The phase detector 130' provides a phase determination signal PD to the delay line control circuit 140 because the SW3 183 is coupled to the delay line control circuit 140 in the DLL mode. The delay line control circuit 140 controls a delay of the delay line 110, including adjusting the CDL 111 and the FDL 112, based on the phase determination signal PD. For example, the delay line control circuit 140 decreases a delay in the delay line 110 when the phase determination signal PD is indicative that a phase of the replica clock signal RCLK is lagging a phase of the internal clock signal PCLK0. On the other hand, if the phase determination signal PD is indicative that the phase of the replica clock signal RCLK is leading of the phase of the internal clock signal PCLK0, the delay line control circuit 140 increases a delay in the delay line 110. The delay line control circuit 140 controls the delay of the delay line 110 such as the CDL 111 and the FDL 112 to lock the phase of the replica clock signal RCLK in synchronization with the phase of the internal clock signal PCLK0 and provide the locked clock signal to the buffer 113. Thus, the read data DQ and the data strobe signal DQS are in synchronization with the external clock signals CK and CKB.

In the DCC mode, the SW1 181 is coupled to the X2 divider circuit replica 180', thus an output signal of the X2 divider circuit replica 180' is provided as the replica clock signal RCLK. Also, the SW2 182 is coupled to an output node of the clock tree replica 114' and a signal with divided frequency is provided. As described earlier, the phase detector 130' detects a phase difference between an X1 signal and an X2 signal. Here, the X1 signal is the replica clock signal RCLK from the X2 divider circuit replica 180', and the X2 signal is a signal from the clock tree replica 114' having a frequency divided by the x2 divider circuit 180. Every other rising edge of the X1 signal scheduled to be synchronized with a falling edge of the X2 signal can be used as a reference timing to monitor the X2 signal. As described earlier, the phase detector 130' detects the falling edge of the X2 signal, and the SW3 183 is coupled to an input node of the DCC controller 170' in the DCC mode. When the falling edge of the X2 signal is either lagging or leading the rising edge of the X1 signal at the reference timing, the phase detector 130' provides first DCC control signals D1 to the DCC controller 170' to reduce or increase a delay of the rising edge of the X1 signal respectively. The first DCC control signals D1 typically are a plurality of bits indicative of a binary value and details are explained later in this disclosure. The DCC controller 170' generates second DCC control signals D2 and provides the second DCC control signals D2 to the DCC 150'. The DCC 150' receives and adjusts the duty cycle of the internal clock signal PCLK0 in response to the received second DCC control signals D2 and provides the internal clock signal PCLK1 as an output signal of the DCC 150'.

Figure 9:
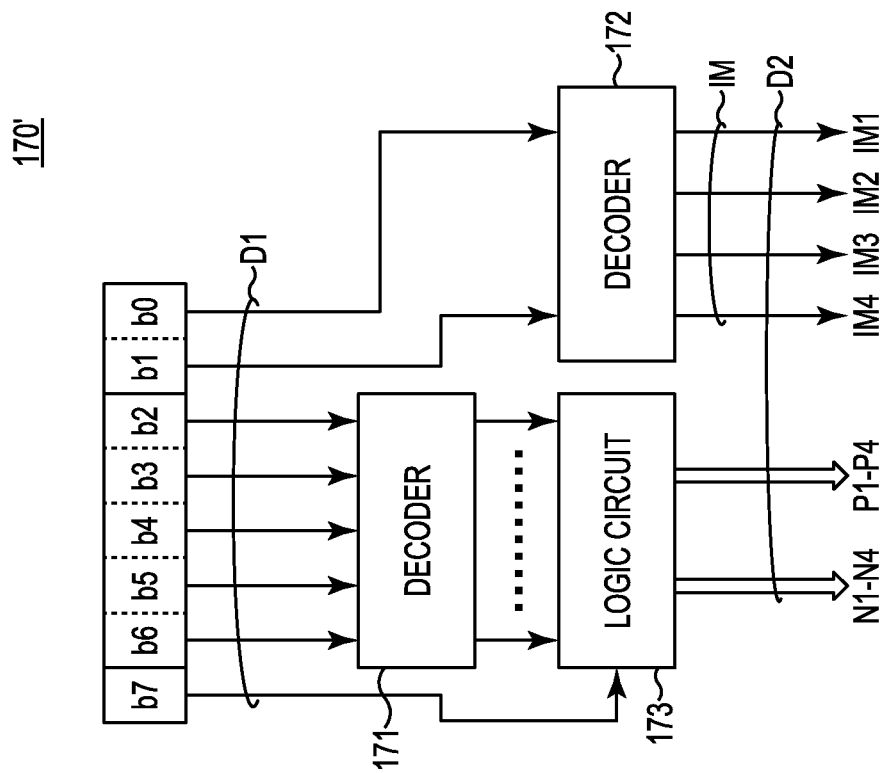
FIG. 9 is a simplified block diagram of a DCC controller in a DLL circuit according to the present disclosure.

FIG. 9 is a schematic diagram of the DCC controller 170' according to one embodiment. The DCC controller 170' receives the first DCC control signals D1 from the phase detector 130'. For example, the first DCC control signals D1 may be, but not limited to, 8-bit signals representing a binary value as shown in FIG. 9. The DCC controller 170' then decodes the first DCC control signals D1, executes logic computation and generates the second DCC control signals D2. In this embodiment, the first DCC control signals have 8 bits. The upper six bits b7 to b2 are used for generating control signals P1 to P4 and N1 to N4, and the lower two bits b1 and b0 are used for generating control signals IM1 to IM4. The most significant bit (MSB) b7 is used for indicating whether a duty cycle of a target signal is above 50% or below 50%. For example, if the first DCC control signal has a value "01111111b" or below, then a duty cycle of an internal clock signal LCLK is below 50%. On the other hand, if the first DCC control signal has a value "10000000b" or above, then the duty cycle of the internal clock signal LCLK is above 50%.

As shown in FIG. 9, the DCC controller 170' includes a first decoder 171 which decodes bits b6 to b2 in the first DCC control signals D1, a second decoder 172 which decodes the lower two bits b1 and b0 of the first DCC control signals D1, and a logic circuit 173. The first and second decoders 171 and 172, and the logic circuit 173 include circuits known in the art, such as logic circuits, that are configured to convert bits of the first DCC control signals to control signals P1-P4, N1-N4, and IM1-IM4. The logic circuit 173 executes logic computations in response to an output signal of the first decoder 171 and the MSB b7 of the first DCC control signals D1. For example, when the MSB b7 is "0" indicative of the duty cycle of the LCLK signal being below 50%, the logic circuit 173 generates control signals P1 to P4 and N1 to N4 to control driving capability of the DCC 150' in a manner that an adjustment amount of the DCC 150' is smaller when a value represented by the b6 to b2 bits is smaller. In contrast, when the MSB b7 is "1" indicative of the duty cycle the LCLK signal being above 50%, the logic circuit 173 generates control signals P1 to P4 and N1 to N4 to control driving capability of the DCC 150' in a manner that an adjustment amount of the DCC 150' is smaller when a value represented by the b6 to b2 bits is larger. The second decoder 172 provides the control signals IM1 to IM4 in order to control synthesis ratio of the signals after the adjustment in the DCC 150'.

In this embodiment, a first control signal set including control signals P1, P3, N2 and N4 is provided to control the duty cycle of the LCLK signal when the MSB b7 is "0", indicative of the duty cycle of the LCLK signal below 50%. In this state, control signals P2, P4, N1 and N3 included in a second control signal set are set to a maximum value (set all bits to a high level). The control signals P1, P3, N2 and N4 included in the first control signal set are associated to each other. In this embodiment, the control signals P1 and P3 have the same value and the control signals N2 and N4 have the same value, and the control signals N2 and N4 are inverted signals of the control signals P1 and P3. Thus, the control signals P1, P3, N2 and N4 in the first control signal set can be generated from one control signal. Similarly, the second control signal set including the control signals P2, P4, N1 and N3 can be provided to control the duty cycle of the LCLK signal when the MSB b7 is "1", indicative of the duty cycle of the LCLK signal above 50%. In this state, the control signals P1, P3, N2 and N4 in the first control signal set are set to the maximum value (set all the bits to a high level). In this embodiment, the control signals P2 and P4 have the same value and the control signals N1 and N3 have the same value, and the control signals N1 and N3 are inverted signals of the control signals P2 and P4. Thus, the control signals P2, P4, N1 and N3 in the second control signal set can be generated from one control signal.

In the embodiment above, the first DCC control signal D1 provided by the phase detector 130' may be in a similar phase delay information format provided to the delay line control circuit 140. Thus, the first DCC control signal D1 is converted by the DCC controller 170' as described in FIG. 9 for use with the DCC 150'. Alternatively, it may be possible to have the phase detector 130' configured to convert the phase delay information format to the data format of the second DCC control signal, when the output node of the x2 divider circuit 180 is connected to the switch 181.

Figure 10:
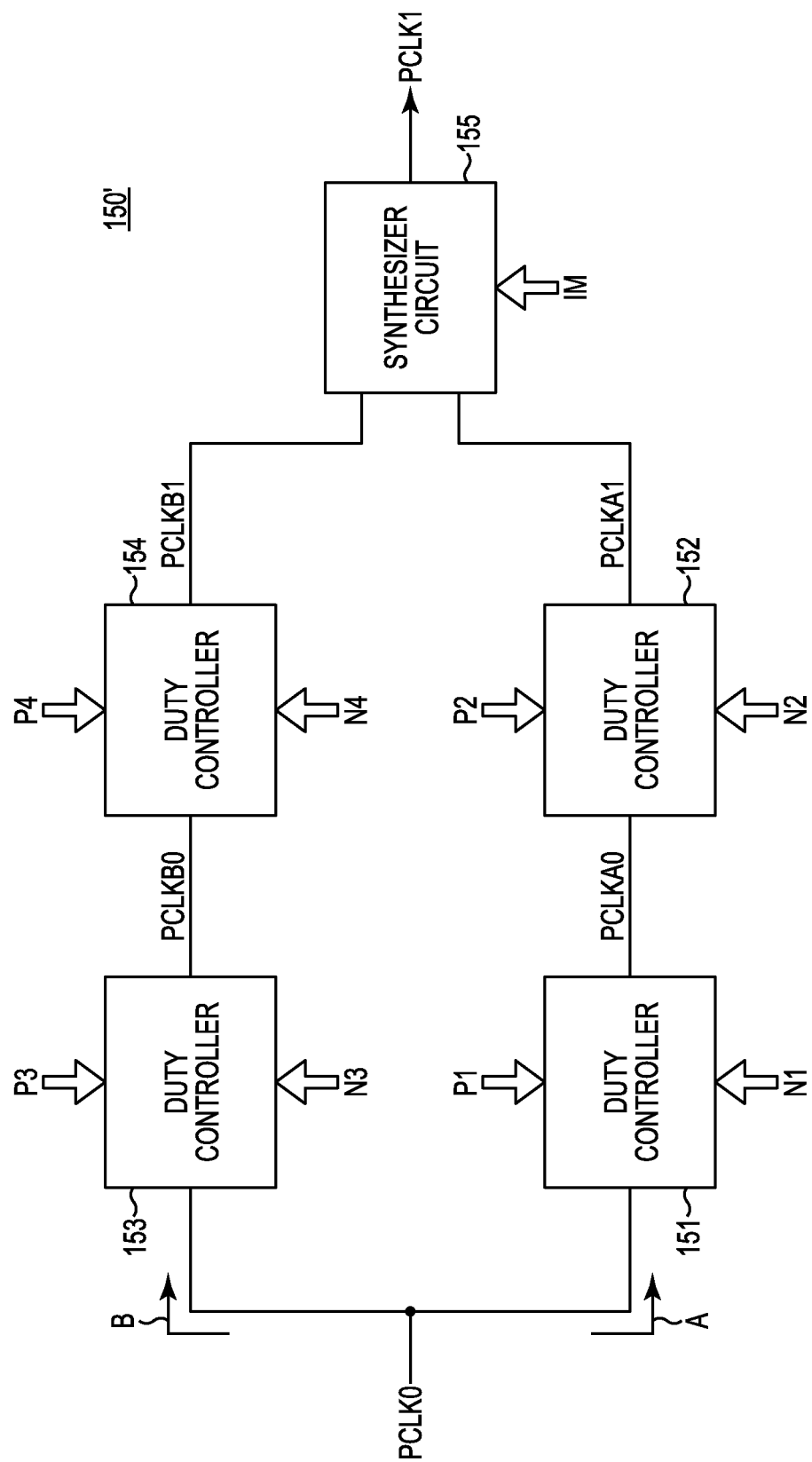
FIG. 10 is a simplified block diagram of a DCC in a DLL circuit according to the present disclosure.

FIG. 10 is a block diagram showing the DCC 150', according to one embodiment. It is possible to apply other types of DCC, however, in other embodiments to reduce a size of a circuit and power consumption of circuits. The DCC 150' includes a plurality of duty controllers 151, 152, 153 and 154 and a synthesizer circuit 155. While four duty controllers are shown in the embodiment of FIG. 10, the number of the plurality of duty controllers is not limited to four.

A first propagation path includes a first duty controller 151 and a second duty controller 152 that are connected in series. Similarly, a second propagation path includes a third duty controller 153 and a fourth duty controller 154 that are connected in series. The first propagation path and the second propagation path are connected in parallel. The synthesizer circuit 155 receives a first internal clock signal PCLKA1 from the first propagation path and a second internal clock signal PCLKB1 from the second propagation path and provides an internal clock signal PCLK1. The duty controllers 151 to 154 may have a similar circuit configuration, and each duty controller changes a through rate of either a rising edge or a falling edge of a clock signal received at each duty controller. For example, the control signals P1 and N1 are received at the first duty controller 151 to provide an internal clock signal PCLKA0, the control signals P2 and N2 are received at the second duty controller 152 to provide an internal clock signal PCLKA1, the control signals P3 and N3 are received at the third duty controller 153 to provide an internal clock signal PCLKB0, and the control signals P4 and N4 are received at the fourth duty controller 154 to provide an internal clock signal PCLKB1. As shown in FIG. 9, the control signals P1 to P4 and N1 to N4 are a portion of the second DCC control signals D2.

Figure 11:
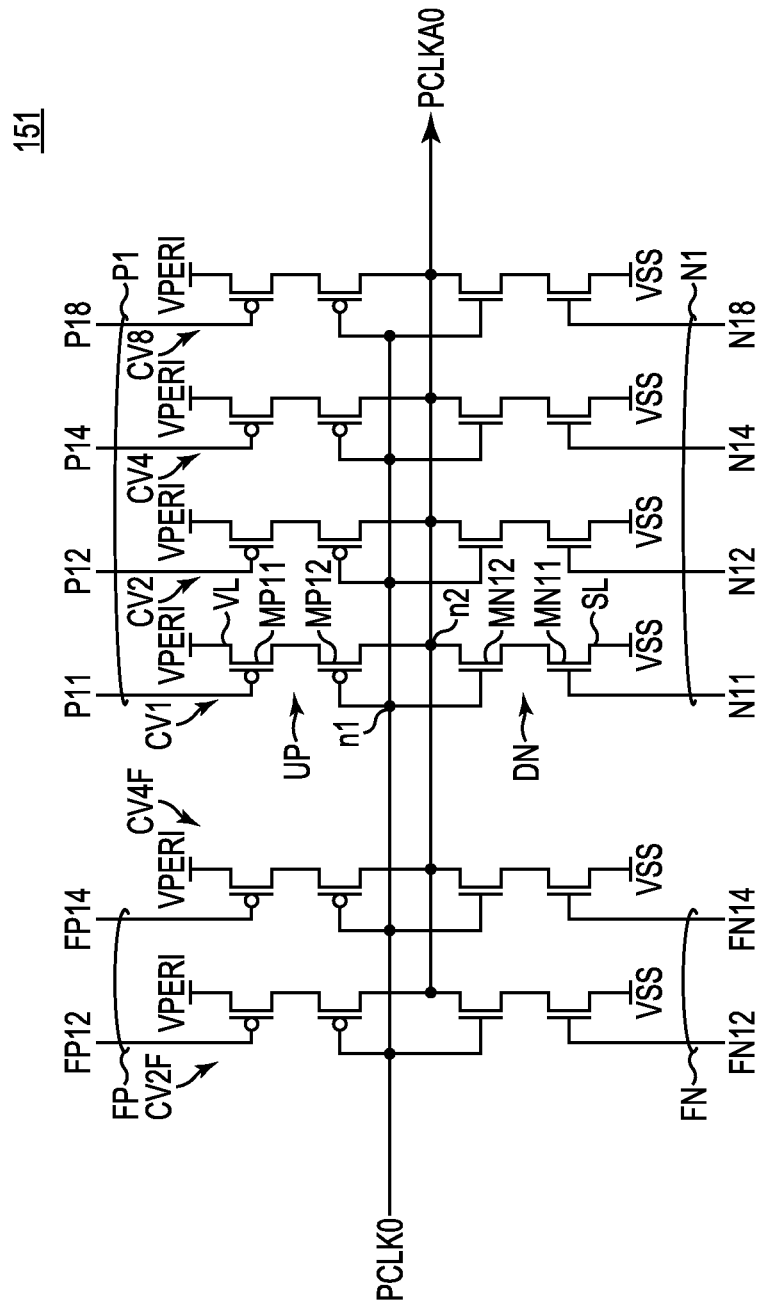
FIG. 11 is a circuit diagram of a duty controller in the DCC according to the present disclosure.

FIG. 11 shows a circuit diagram of a duty controller 151 according to one embodiment. As shown in FIG. 11, the duty controller 151 includes six clocked inverters CV1, CV2, CV4, CV8, CV2F and CV4F connected in parallel. As shown in FIG. 10, the duty controller 151 receives the internal clock PCLK0 and provides the internal clock signal PCLKA0. These six clocked inverters have a similar circuit configuration, and the clocked inverter CV1 is described as an example. The clocked inverter CV1 includes P-channel transistors MP11 and MP12 and N-channel transistors MN12 and MN11, series-connected. A source of the P-channel transistor MP11 is connected to a first power supply line VL where an internal potential VPERI is supplied and a source of the N-channel transistor MN11 is connected to a second power supply line SL where a ground potential VSS is supplied. Gate electrodes of the P-channel transistor MP12 and the N-channel transistor MN12 are commonly connected and function as an input node n1 to which the internal clock signal PCLK0 is supplied. Furthermore, drains of the P-channel transistor MP12 and the N-channel transistor MN12 are commonly connected and function as an output node n2 from which the internal clock signal PCLKA0 is provided.

A gate electrode of the P-channel transistor MP11 receives a control signal P11 which is a portion of the control signal P1. When the control signal P11 is set to a low level, the clocked inverter CV1 is activated to pull up the output node n2 based on a level of the input node n1. When the control signal P11 is set to a high level, the clocked invertor CV1 is stopped and unable to pull up the output node n2. Thus, the series-connected transistors MP11 and MP12 function as a pull-up circuit UP selectively activated by the control signal P11. Similarly, a gate electrode of the N-channel transistor MN11 receives a control signal N11 which is a portion of the control signal N1. When the control signal N11 is set to a high level, the clocked inverter CV1 is activated to pull down the output node n2 based on the level of the input node n1. When the control signal N11 is set to a low level, the clocked invertor CV1 is stopped and unable to pull down the output node n2. Thus, the series-connected transistors MN11 and MN12 function as a pull-down circuit DOWN selectively activated by the control signal N11.

As described above, unlike a conventional clocked inverter, the clocked inverter CV1 is able to control the pull-up circuit UP and the pull-down circuit DOWN independently. The other clocked inverters CV2, CV4, CV8, CV2F and CV4F have a similar circuit configuration other than receiving corresponding control signals and internal clock signals and providing corresponding internal clock signals. Driving capabilities of the clocked inverters CV1, CV2, CV4, CV8, CV2F and CV4F may be designed to have power-of-two weights. For example, when the clocked inverter CV1 has a driving capability of DC1, the driving capabilities of the clocked inverters CV2, CV4 and CV8 are 2DC, 4DC and 8DC respectively. Thus, pull-up capability can be controlled by sixteen steps (0DC to 15DC) by control signals P11, P12, P14 and P18 of the control signal P1. Similarly, pull-down capability can be controlled by sixteen steps (0DC to 15DC) by control signals N11, N12, N14 and N18 of the control signal N1.

As previously described, the control signals P1 and N1 are generated in the DCC controller 170' based on the first DCC control signals D1. The clocked inverters CV2F and CV4F have driving capabilities 2DC and 4DC, respectively, and provide static driving capabilities to the duty controller 151. Activation of these clocked inverters CV2F and CV4F can be selected by fuse signals FP and FN and these fuse signals may be used for changing an adjustment ratio between the pull-up capability and the pull-down capability of the duty controller 151 by activating the clocked inverter CV2F and CV4F. For example, if the clocked inverter CV2F is activated and the clocked inverter CV4F is not activated, the driving capability of the duty controller 151 ranges from 2DC to 17DC and the adjustment ratio between a maximum driving capability and a minimum driving capability is 8.5 (=17/2). On the other hand, when the clocked inverters CV2F and CV4F are both activated, the driving capability of the duty controller 151 ranges from 6DC to 21DC the adjustment ratio between the maximum driving capability and the minimum driving capability is 3.5 (=21/6). The former adjustment ratio is suitable for a relative low speed product with a large adjustment range of the duty, whereas the former adjustment ratio is suitable for a relatively high speed product with fine adjustment step size of the duty. Thus, a rising edge of the internal clock signal PCLKA0 from the duty controller 151 can be controlled based on the control signals P1 and FP, and the falling edge of the internal clock signal PCLKA0 from the duty controller 151 can be controlled based on the control signals N1 and FN. The other duty controllers 152, 153 and 154 have the similar circuit configuration, except having their respective control signals. As previously described, the duty controllers 152, 153 and 154 receive the internal clock signals PCLKA0, PCLK1 and PCLKB0 and provide the internal clock signals PCLKA1, PCLKB0 and PCLKB1, respectively. The internal clock signals PCLKA1 and PCLKB1 are provided to the synthesizer circuit 155.

Figure 12:
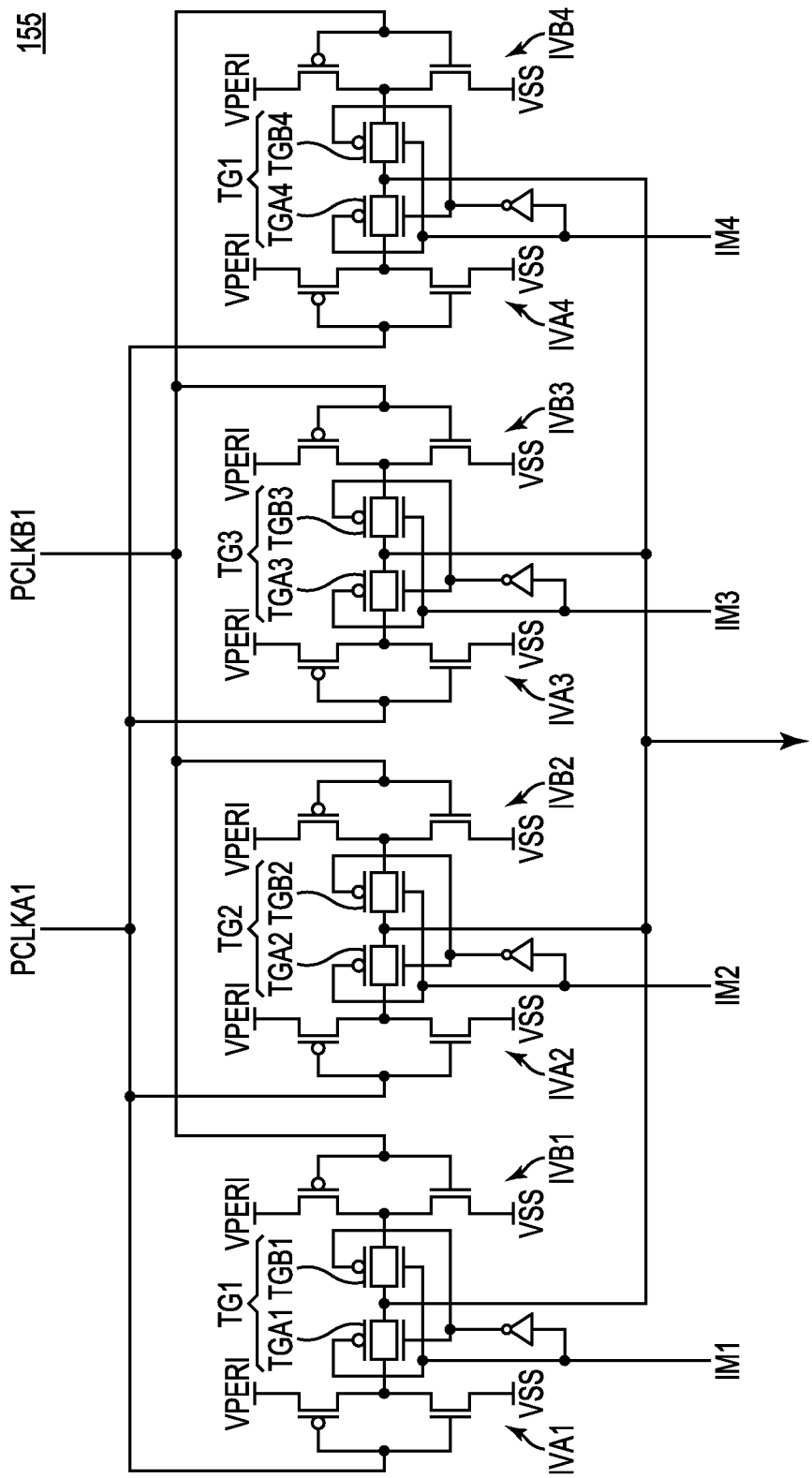
FIG. 12 is a circuit diagram of a synthesizer circuit in the DCC according to the present disclosure.

FIG. 12 shows a circuit diagram of a synthesizer circuit 155 according to one embodiment. The synthesizer circuit 155 includes first four inverter circuits IVA1 to IVA4 which receive an internal clock signal PCLKA1 and further includes second four inverter circuits IVB1 to IVB4 which receive an internal clock signal PCLKB1. The synthesize circuit 155 also includes transfer gate pairs TG1 to TG4. Each transfer gate pairs has two transfer gates (e.g. TGA1 and TGB1 for TG1), having one of the gates conductive in response to respective control signals IM1 to IM4. Output signals of the inverter circuits IVA1 to IVA4 and IVB1 to IVB4 are synthesized via the conductive gates of the transfer gate pairs TG1 to TG4, thus a synthesis ratio of the internal clock signals PCLKA1 and PCLKB1 can be controlled according to the control signals IM1 to IM4. For example, when three of the transfer gates TGA1 to TGA4 are conductive and one of the transfer gates TGB1 to TGB4 is conductive, the synthesis ratio of the internal clock signals PCLKA1 and PCLKB1 is 3:1 to provide the internal clock signal PCLK1. Thus, a phase of the internal clock signal PCLK1 can be controlled to be between the phase of PCLKA1 and PCLKB1 depending on the synthesis ratio. As previously described, the controls signals IM1 to IM4 are a portion of the second DCC control signals D2. The second DCC control signals D2 generated in the DCC controller 170' includes control signals P1 to P4, N1 to N4 and IM1 to IM4.

According to various aspects of the present disclosure, duty-cycle displacement is corrected and the duty cycle is adjusted to 50%. In various embodiments of the present disclosure, a phase detector detects a relationship between a reference edge of a reference signal and a target edge of a target signal having its frequency divided and cycle multiplied. For detection of these signal edges, a DCD may not be needed, but instead, the phase detector may be used. Thus, it may be possible to reduce circuit size and power consumption compared to conventional designs. While the embodiments of the present disclosure are applied to a DLL circuit, the invention can be applied to any other circuits combined with the DCC.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
a duty cycle corrector (DCC) configured to receive an input clock signal and a control signal and to produce an output clock signal responsive, at least in part, to the input clock signal and the control signal;
a circuit configured to divide a frequency of the input clock signal by N and to generate an intermediate clock signal, wherein N is an integer more than 1;
a phase detector configured to generate the control signal responsive, at least in part, to a difference in phase between the output clock signal and the intermediate clock signal; and
a replica circuit configured to receive the intermediate clock signal and to model a propagation delay between a node of the input clock signal and a node of the output clock signal.

2. The apparatus of claim 1, wherein the phase detector is configured to detect a first edge type of the output clock signal every $N^{th}$ cycle and a second edge type of the intermediate clock signal, and to compute the difference in phase between the detected first edge type and the detected second edge type.

3. The apparatus of claim 1, further comprising a DCC controller configured to convert the control signal to an internal control signal for the DCC.

4. The apparatus of claim 3 wherein the DCC controller is in the DCC.

5. The apparatus of claim 1, further comprising:
a switch configured to couple an output node of the replica circuit to an input node of the phase detector in a first mode, and to couple an output node of the replica circuit in a second mode, and
wherein the phase detector is further configured to provide the control signal to a delay line control circuit configured to control the delay line in the first mode, and to provide the control signal to a DCC controller in the second mode, in response to a state of the switch.

6. The apparatus of claim 5, wherein the DCC controller is in the phase detector.

7. A method of correcting a duty cycle, comprising:
receiving an input clock signal and a control signal on a first path;
producing a target clock signal on the first path responsive, at least in part, to the input clock signal and the control signal, including adjusting the duty cycle of the input clock signal based on the control signal;
dividing a frequency of the input clock signal by N to provide an intermediate clock signal on a second path, wherein N is a positive even integer more than 1;
detecting a difference in phase between the target clock signal and the intermediate clock signal;
generating the control signal responsive, at least in part, to the difference in phase;
receiving the intermediate clock signal; and
compensating the intermediate clock signal for propagation delay between a node of the input clock signal and a node of the target clock signal.

8. The method of correcting the duty cycle of claim 7, further comprising:
detecting a first edge type of the target clock signal every $N^{th}$ cycle and a second edge type of the intermediate clock signal; and
determining the difference in phase between the detected first edge type and the detected second edge type representing a duty-cycle displacement.

9. The method of correcting the duty cycle of claim 8, further comprising converting the control signal to an internal control signal for duty cycle correction.

10. The method of correcting the duty cycle of claim 9, wherein the control signal comprises information regarding the difference in phase and the internal control signal comprises a set of signals, wherein each signal of the set of signals is provided to its corresponding duty control circuit in the DCC.

11. The method of correcting the duty cycle of claim 7, further comprising:
providing the intermediate clock signal after the compensation of the propagation delay for the detection of the difference in phase in a first mode for delay line control;
providing the frequency-divided input clock signal as the intermediate clock signal for the detection of the difference in phase in a second mode for duty cycle correction (DCC);
providing the control signal for delay line control in the first mode; and
converting the control signal to an internal control signal for the DCC in the second mode.

12. An apparatus, comprising:
a delay line configured to control a delay of a first internal clock signal to provide a second internal clock signal;
a replica circuit having a delay and configured to provide a third internal clock signal having the delay relative to the second internal clock signal;
a frequency divider circuit configured to divide a frequency of the third internal clock signal by N in order to provide an intermediate clock signal, wherein N is a positive even integer;
a phase detector configured to generate a first control signal responsive, at least in part, to a difference in phase between the intermediate clock signal and an input clock signal;
a duty cycle corrector (DCC) controller configured to receive the first control signal and to provide a second control signal; and
a DCC configured to receive an input clock signal and the second control signal and to produce the first internal clock signal responsive, at least in part, to the input clock signal and the second control signal.

13. The apparatus of claim 12, wherein the phase detector is configured to detect a first edge type of the input clock signal every $N^{th}$ cycle and a second edge type of the intermediate clock signal, and to determine the difference in phase between the detected first edge type and the detected second edge type.

14. The apparatus of claim 13, wherein the DCC controller is in the DCC, and
wherein the DCC further comprises one or more duty controllers, each configured to receive a corresponding clock signal and to control the corresponding clock signal according to a corresponding portion of the second signal from the DCC controller.

15. The apparatus of claim 12, wherein the replica circuit is configured to model a propagation delay caused by components between a node of the input clock signal and a node of the output clock signal.

16. The apparatus of claim 12, further comprising:
a switch configured to couple an output node of the replica circuit to an input node of the phase detector in the first mode, and to couple an output node of the frequency divider circuit in the second mode.

17. The apparatus of claim 16, wherein the phase detector is further configured to provide the first control signal to a delay line control circuit configured to control the delay line in the first mode, and to provide the first control signal to the DCC controller in the second mode.

18. The apparatus of claim 17, wherein the DCC controller is included in the phase detector, and the DCC controller comprises:
   a first decoder configured to decode a first plurality of bits of the first control signal and provide decoded signals based on the first plurality of bits;
   a logic circuit coupled to the first decoder and configured to provide at least a first portion of DCC control signals based on the decoded signals; and
   a second decoder configured to decode a second plurality of bits of the first control signal and provide a second portion of DCC control signals based on the second plurality of bits.

\* \* \* \* \*